United States Patent
Sankaranarayanan

(10) Patent No.: US 9,178,473 B2
(45) Date of Patent: Nov. 3, 2015

(54) DISTORTION CANCELLATION FOR LOW NOISE AMPLIFIER (LNA) NON-LINEAR SECOND ORDER PRODUCTS

(71) Applicant: QUALCOMM Incorporated, San Diego, CA (US)

(72) Inventor: Janakiram Ganesh Sankaranarayanan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 78 days.

(21) Appl. No.: 14/133,719

(22) Filed: Dec. 19, 2013

(65) Prior Publication Data

US 2015/0180423 A1  Jun. 25, 2015

(51) Int. Cl.
| | |
|---|---|
| H03F 3/68 | (2006.01) |
| H03F 1/26 | (2006.01) |
| H03F 3/193 | (2006.01) |
| H03F 1/22 | (2006.01) |
| H03F 1/32 | (2006.01) |

(52) U.S. Cl.
CPC .................. *H03F 1/26* (2013.01); *H03F 1/223* (2013.01); *H03F 1/3205* (2013.01); *H03F 3/193* (2013.01); *H03F 3/68* (2013.01); H03F 2200/09 (2013.01); H03F 2200/144 (2013.01); H03F 2200/151 (2013.01); H03F 2200/181 (2013.01); H03F 2200/294 (2013.01); H03F 2200/372 (2013.01); H03F 2200/451 (2013.01); H03F 2200/492 (2013.01); H03F 2200/541 (2013.01)

(58) Field of Classification Search
USPC ...................................... 330/295, 124 R, 195
IPC ......................................................... H03F 3/68
See application file for complete search history.

(56) References Cited

U.S. PATENT DOCUMENTS

| | | | |
|---|---|---|---|
| 6,359,513 B1 * | 3/2002 | Kuo et al. ..................... 330/276 |
| 7,889,007 B2 | 2/2011 | Kim et al. | |
| 7,898,418 B2 | 3/2011 | Safarian et al. | |
| 7,994,865 B1 * | 8/2011 | Manstretta et al. ........... 330/301 |
| 8,149,955 B2 | 4/2012 | Tired | |
| 8,514,021 B2 | 8/2013 | Heikkinen et al. | |
| 8,594,603 B2 * | 11/2013 | Balankutty et al. ........... 455/296 |
| 2003/0042983 A1 * | 3/2003 | Hollenbeck et al. .......... 330/301 |

(Continued)

FOREIGN PATENT DOCUMENTS

| | | |
|---|---|---|
| EP | 1732209 A1 | 12/2006 |
| WO | 2011019850 A1 | 2/2011 |

OTHER PUBLICATIONS

International Search Report and Written Opinion—PCT/US2014/070772—ISA/EPO—Apr. 2, 2015.

(Continued)

*Primary Examiner* — Patricia T Nguyen
(74) *Attorney, Agent, or Firm* — Smith Risley Tempel Santos LLC

(57) ABSTRACT

A device includes a main low noise amplifier (LNA) stage configured to amplify a single-ended communication signal, an auxiliary LNA stage coupled to the main LNA stage, the auxiliary LNA stage configured to cancel non-linear second order products generated by the main LNA stage, and a load circuit configured to receive an output of the main LNA stage and an output of the auxiliary LNA stage, the load circuit configured to convert the single-ended communication signal to a differential signal.

18 Claims, 7 Drawing Sheets

(56) References Cited

U.S. PATENT DOCUMENTS

| | | |
|---|---|---|
| 2003/0095005 A1* | 5/2003 | Morie et al. .................. 330/254 |
| 2007/0229154 A1 | 10/2007 | Kim et al. |
| 2011/0043286 A1* | 2/2011 | Youngblood ................. 330/295 |
| 2012/0077453 A1 | 3/2012 | Ahrari et al. |
| 2013/0315348 A1 | 11/2013 | Tasic et al. |
| 2014/0355728 A1* | 12/2014 | Liao et al. .................... 375/346 |
| 2015/0111514 A1* | 4/2015 | Harwalkar et al. ........ 455/252.1 |

OTHER PUBLICATIONS

Yanduru et al: "A WCDMA, GSM/GPRS/EDGE Receiver Front End without Interstage SAW Filter" Radio Requency Integrated Circuits (RFIC) Symposium, 2006 IEEE, IEEE, Piscataway NI, USA, Jun. 11, 2006, pp. 9-12, XP010925083.

* cited by examiner

US 9,178,473 B2

DISTORTION CANCELLATION FOR LOW NOISE AMPLIFIER (LNA) NON-LINEAR SECOND ORDER PRODUCTS

BACKGROUND

1. Field

The present disclosure relates generally to electronics, and more specifically to transmitters and receivers.

2. Background

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover the information contained in the communication signal. The transceiver also includes circuitry that enables the transmission of a communication signal to a receiver in another transceiver. The transceiver may be able to operate over multiple frequency ranges, typically referred to a frequency bands. Moreover, a single transceiver may be configured to operate using multiple carrier signals that may occur in the same frequency band, but that may not overlap in actual frequency, an arrangement referred to as non-contiguous carriers.

In some instances, it is desirable to have a single transmitter or receiver that is configured to operate using multiple transmit frequencies and/or multiple receive frequencies. For a receiver to be able to simultaneously receive two or more receive signals, the concurrent operation of two or more receive paths is required. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate and non-contiguous carrier signals that occur in the same communication band. Currently, even though these non-contiguous carriers may be close together, a separate receive chain is typically needed to process each carrier. When implementing such a carrier aggregation receiver, it is possible that power from one carrier may interfere with the downconversion of another carrier (causing what is referred to as inter-modulation distortion, and when occurring as a second-order function, is referred to as IM2) that can lead to desensitizing the receiver, a condition sometimes referred to as "receiver desensitization" or "receiver desense." Receiver desensitization may occur due to the presence of second-order distortion caused by the operation of the low noise amplifier (LNA). The second order intercept point (IIP2) refers to a measure of linearity that quantifies the second-order distortion generated by non-linear systems and devices, in this example, the LNA.

At low power levels, the fundamental output power of the LNA rises in a one-to-one ratio (in terms of dB) with respect to the input power, while the second-order output power rises in a two-to-one ratio. If the input power is high enough for the LNA to reach saturation, the output power flattens out in both the first- and second-order cases.

The second order intercept point (IIP2) is the output power point at which the extrapolated first- and second-order lines intersect on a plot, since the actual power levels will flatten off due to saturation at much lower power level typically.

It would be desirable to reduce receiver desensitization caused by second-order non-linearities, particularly those caused by the LNA.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

Exemplary embodiments of the disclosure are directed to a distortion cancellation scheme using an auxiliary path to cancel non-linear second order distortion products of a low noise amplifier (LNA), and can be applied to any receiver system using a LNA to amplify a receive signal. In an exemplary embodiment, an auxiliary LNA stage and a main LNA stage provide outputs to a center tapped transformer operating as a load circuit. In an exemplary embodiment, an auxiliary LNA stage generates non-linear products which cancel non-linear products generated by the main LNA stage. In an exemplary embodiment, the load circuit also has an adjustable resistance that operates as an attenuator connected in shunt with the auxiliary LNA stage output so that non-linear products generated by the auxiliary LNA stage can be matched to the levels of the non-linear products generated by the main LNA stage. In another exemplary embodiment, a primary side of the load circuit is provided in a non-center tapped configuration so that non-linear products generated by the auxiliary LNA stage can be matched to the levels of the non-linear products generated by the main LNA stage without an attenuator. In an exemplary embodiment, the auxiliary LNA stage is controlled to be operational only when IM2 cancellation is desired, for example, in a carrier-aggregation communication methodology.

Figure 1:
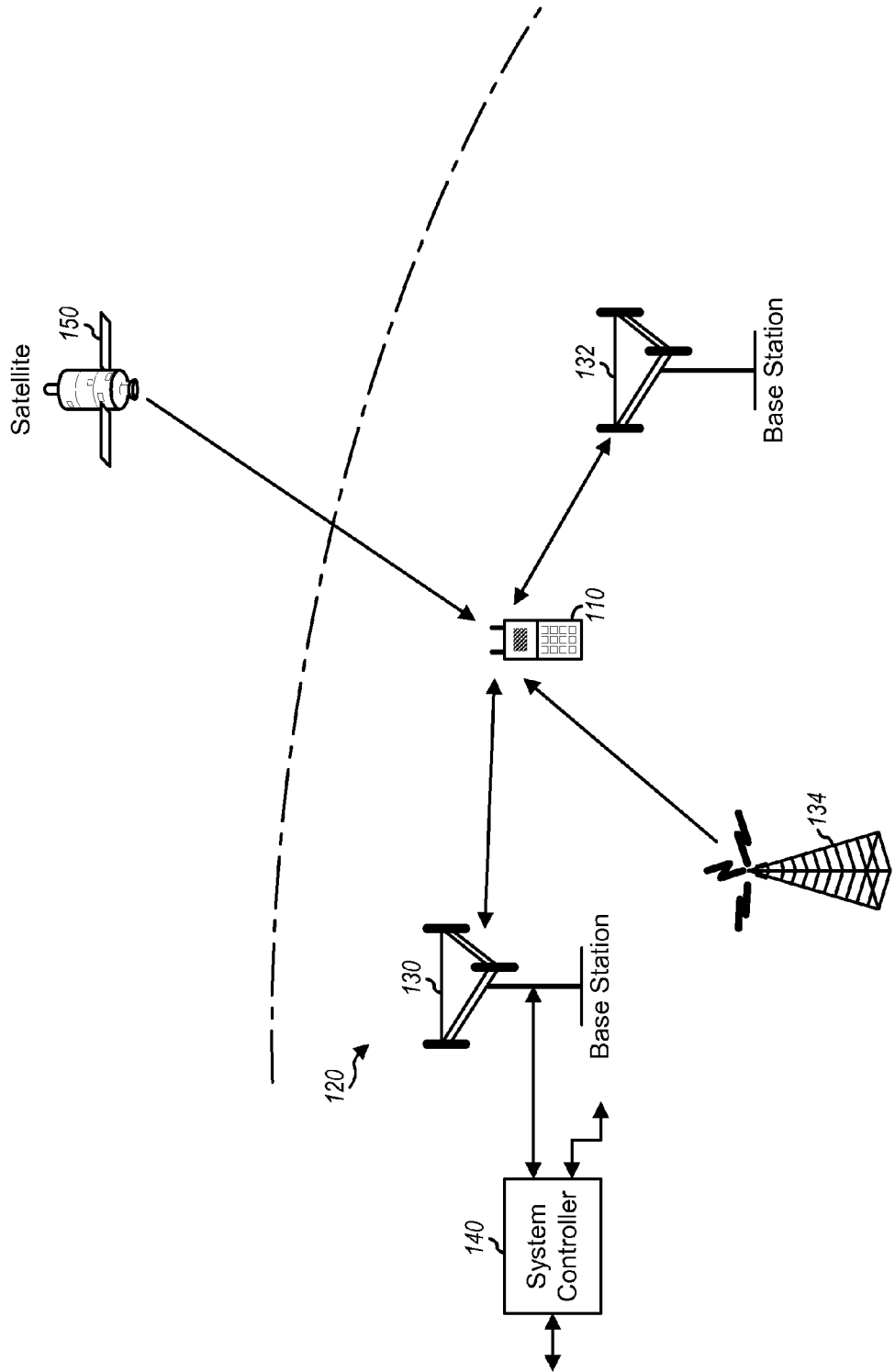
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
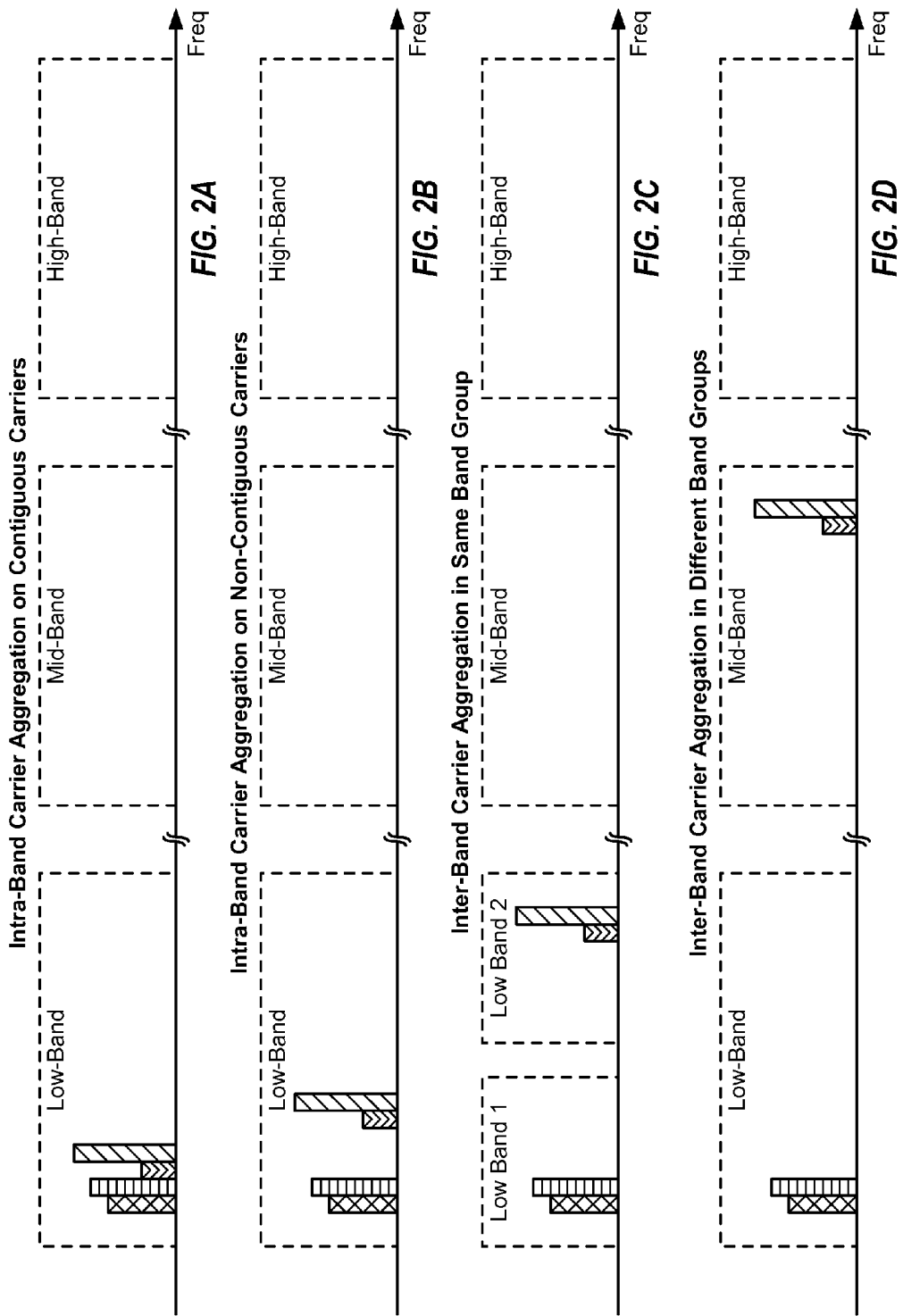
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
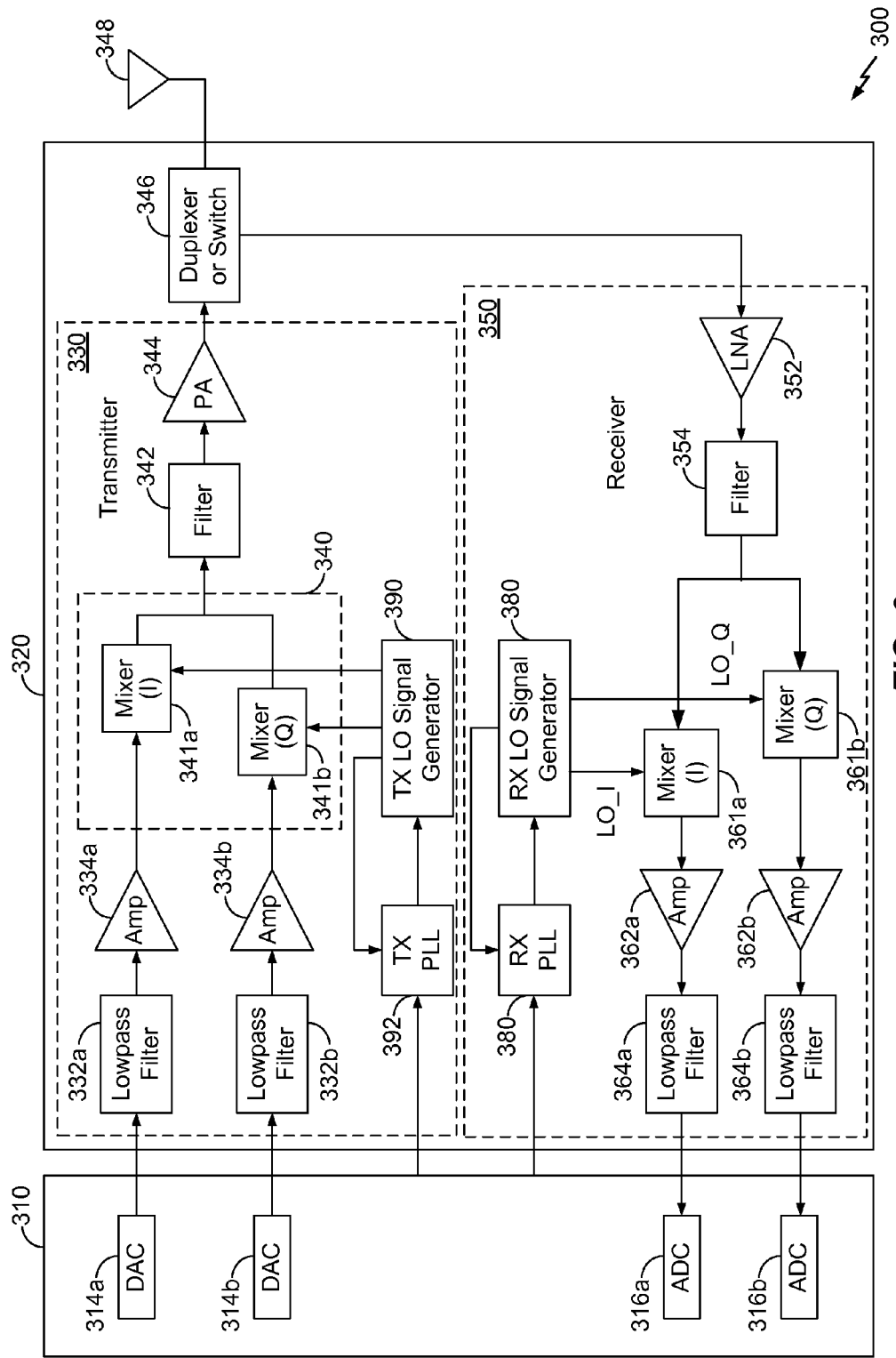
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers.

In a CA communication environment where multiple receive signals are processed simultaneously, it is possible that a receive signal on a particular receive path can couple to and impair the sensitivity of a receiver operating on a receive signal on a different receive path.

In an exemplary embodiment of the present disclosure, non-linear second order intermodulation (IM2) products, also referred to herein as non-linear second order products, generated by the LNA are substantially cancelled to mitigate any degradation in NF caused by the above-mentioned undesirable coupling of receive energy from one receive path to another receive path, or from other interfering signals coupled to the subject receive path. Reducing the non-linear second order intermodulation (IM2) products generated by the LNA improves the second order intercept point (IIP2) performance of the receiver, and thus makes the receiver less-susceptible to interference from another receive path, or from interfering signals in general.

Figure 4:
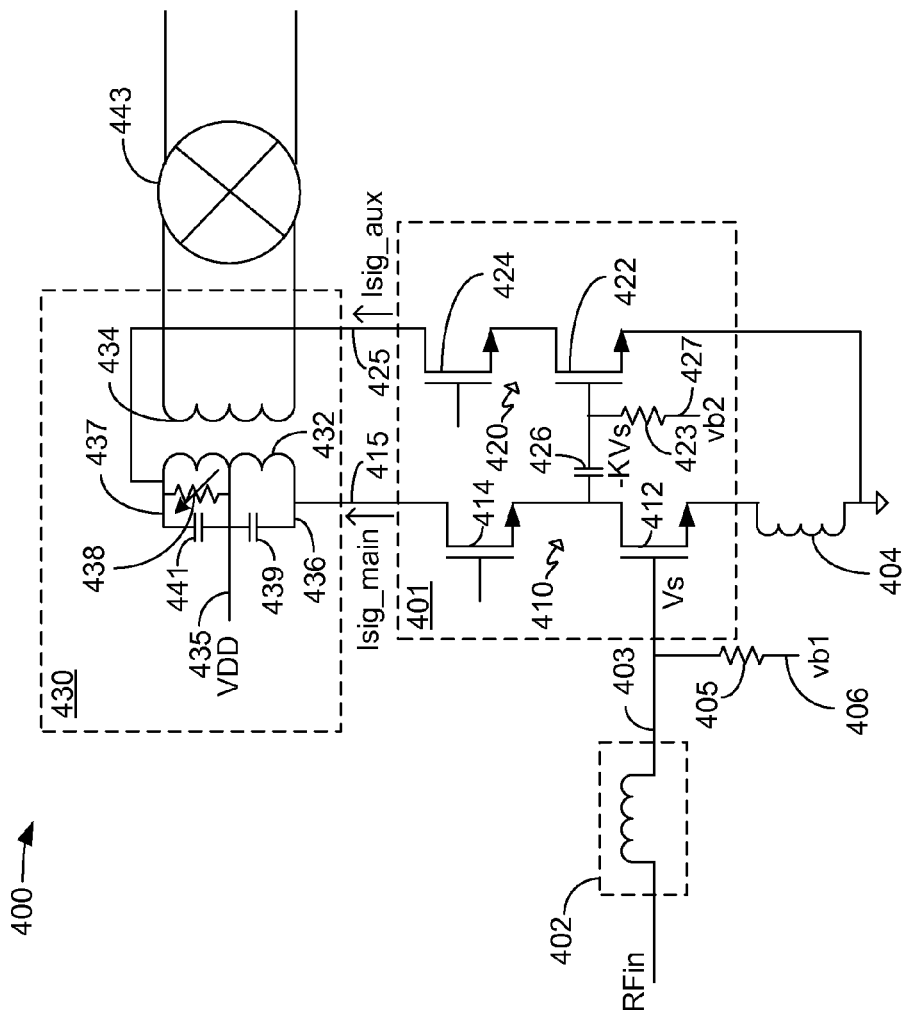
FIG. 4 is a schematic diagram illustrating an exemplary embodiment of a circuit having a low noise amplifier (LNA) that can be used to cancel non-linear second order distortion products in a LNA.

FIG. 4 is a schematic diagram illustrating an exemplary embodiment of a circuit 400 having a low noise amplifier (LNA) 401 that can be used to cancel non-linear second order products in the LNA 401. A single-ended radio frequency (RF) input signal is provided through an external inductance 402 to a main LNA stage 410. The main LNA stage 410 comprises a transistor 412 and a transistor 414. In an exemplary embodiment, the transistor 412 operates as a gain transistor and the transistor 414 operates as a cascode transistor. The transistor 412 is biased by a signal, vb1, on connection 406 applied to its gate through a resistance 405. The single-ended RF input signal on connection 403 is provided to the gate of the transistor 412. The source of the transistor 412 is connected to a source degeneration inductance 404. The drain of the transistor 412 is coupled to the source of the transistor 414. The output of the main LNA stage 410 is provided from the drain of the transistor 414 to a load circuit 430 over connection 415. The current flowing in connection 415 can be referred to as "Isig_main." The load circuit 430 is an inductive circuit and is also referred to herein as a balun, which performs single-ended to differential conversion. The load circuit 430 generally comprises a primary side 432 and a secondary side 434. A single-ended RF communication signal is provided to the primary side 432 of the load circuit 430. The output of the load circuit 430 is provided from the secondary side 434 as a differential RF signal to a mixer 443 for downconversion and further processing.

In an exemplary embodiment, the primary side 432 of the load circuit 430 includes a center tap 435 at a system voltage VDD that divides the primary side 432 into a first, or main, portion 436 and a second, or auxiliary, portion 437. The main portion 436 receives the output of the main LNA stage 410 over connection 415 and through a capacitance 439.

The circuit 400 also comprises an auxiliary LNA stage 420. The auxiliary LNA stage 420 comprises a transistor 422 and a transistor 424. In an exemplary embodiment, the transistor 422 operates as a gain transistor and the transistor 424 operates as a cascode transistor. The transistor 422 is controlled and biased by a signal, vb2, on connection 427 applied to its gate through a resistor 423. The gate of the transistor 422 is connected to the drain of the transistor 412 through a capacitance 426. The drain of the transistor 422 is coupled to the source of the transistor 424. The output of the auxiliary LNA stage 420 is provided from the drain of the transistor 424 to the auxiliary portion 437 of the load circuit 430 over connection 425 and through a capacitance 441. The current flowing in connection 425 can be referred to as "Isig_aux." An attenuator 438, which, in an exemplary embodiment, can be implemented using an adjustable resistance, is coupled between the auxiliary portion 437 and the center tap 435 of the load circuit 430.

To minimize current consumption in the auxiliary LNA stage 420, the physical size of the transistors 422 and 424 is generally smaller than the physical size of the transistors 412 and 414, respectively, so that the current Isig_aux on connection 425 is smaller than the current Isig_main on connection 415 such that the signal generated by the auxiliary LNA stage 420 is smaller than the signal generated by the main LNA stage 410. In operation, the transistor 422 is generally biased in a non-linear region so that non-linear second order products generated by the auxiliary LNA stage 420 can be generated which are higher than and which can cancel the non-linear second order products generated by the main LNA stage 410, even though the transistors 422 and 424 are respectively smaller than the transistors 412 and 414. In this manner, the operation of the auxiliary LNA stage 420 generally cancels non-linear second order (and all even order) products generated by the transistor 412. The non-linear second order products generated by the auxiliary LNA stage 420 are higher than the non-linear second order products generated by the main LNA stage 410, so adjusting the attenuator 438 allows the non-linear second order products produced by the auxiliary LNA stage 420 to match the levels of the non-linear second order products produced by the main LNA stage 410, such that the non-linear second order products produced by the main LNA stage 410 are canceled by the non-linear second order products produced by the auxiliary LNA stage 420. The attenuator 438 can be implemented, for example, as a switchable resistor bank controlled by a digital control signal (not shown), or can be implemented in other ways to match, or equalize, the gain of the auxiliary LNA stage 420 to the gain of the main LNA stage 410 at the frequency associated with the second-order products. In other words, the attenuator 438 is used to ensure that the gain of the non-linear second order products of the auxiliary LNA stage 420 matches the gain of the non-linear second-order products of the main LNA stage 410 so that these products cancel.

The current Isig_main is given by:

$$Isig\_main = g_1 \cdot Vs + g_2 \cdot Vs^2 + g_3 \cdot Vs^3 \quad (Eq. 1)$$

The current Isig_aux is given by:

$$Isig\_aux = K \cdot g_1' \cdot (-Vs) + K \cdot g_2' \cdot Vs^2 + K \cdot g_3' \cdot (-Vs)^3 \quad (Eq. 2)$$

$$Isig\_main - Isig\_aux = (g_1 + Kg_1') \cdot Vs + (g_2 - Kg_2') \cdot Vs^2 + (g_3 + Kg_3') \cdot Vs^3 \quad (Eq. 3)$$

The terms "$g_1$" and "$g_1'$" refer to the "effective" transconductance of the transistors 412 and 422, respectively. The term –K refers to the gain of Vs at the drain of the transistor 412. The term $(g_2 - Kg_2') \cdot Vs^2$ can be cancelled by biasing the transistor 422 at the point where the second-order products can be maximized, i.e., the point at which "$g_2'$" is maximized. The term "$g_2'$" refers to the first order differential of the term "$g_1'$" with respect to the gate-source voltage (Vgs) of the transistor 422.

Exemplary embodiments of the auxiliary LNA stage 420 can be easily incorporated into an existing LNA architecture and can be enabled and disabled dynamically with a control signal over connection 427 depending on a number of factors including, for example, whether second order non-linearity cancellation is needed. For example, the auxiliary LNA stage 420 can be activated only when carrier aggregation is present that can benefit from the second order cancellation.

Figure 5:
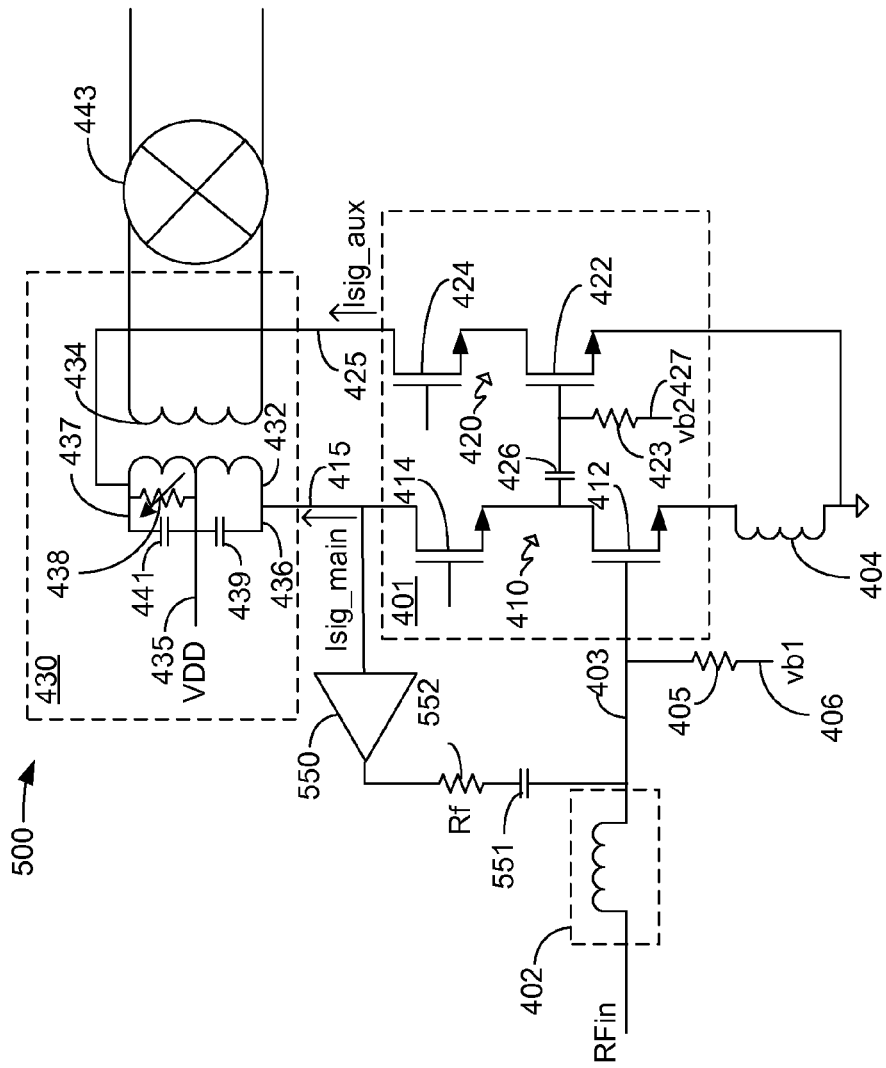
FIG. 5 is a schematic diagram illustrating another exemplary embodiment of a circuit having a low noise amplifier (LNA) that can be used to cancel non-linear second order distortion products in the LNA.

FIG. 5 is a schematic diagram illustrating another exemplary embodiment of a circuit 500 having a low noise amplifier (LNA) 401 that can be used to cancel non-linear second order distortion products in the LNA 401. The exemplary embodiment shown in FIG. 5 includes a source follower buffer 550, a feedback resistance (Rf) 552 and an inductance 551. The circuit 500 uses resistive feedback through the feedback resistance 552 to achieve the desired 50 ohm matching instead of using an input matching network. Using resistive feedback instead of an input matching circuit may lead to undesirable loading between the output of the transistor 414 on connection 415 and the input to the transistor 412 on connection 403. The source follower buffer 550 is used to reduce this undesirable loading between the output of the transistor 414 on connection 415 and the input to the transistor 412 on connection 403.

Figure 6:
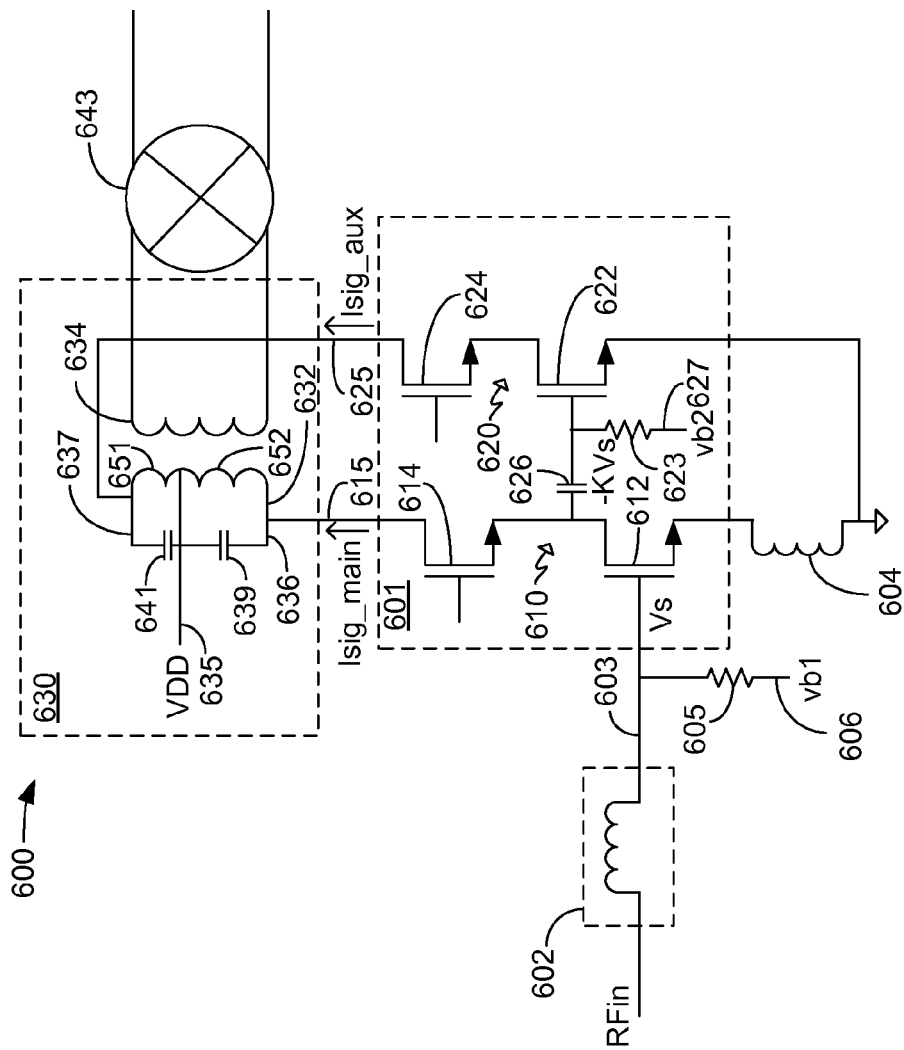
FIG. 6 is a schematic diagram illustrating an exemplary alternative embodiment of a circuit having a low noise amplifier (LNA) that can be used to cancel non-linear second order distortion products in the LNA.

FIG. 6 is a schematic diagram illustrating an exemplary alternative embodiment of a circuit 600 having a low noise amplifier (LNA) 601 that can be used to cancel non-linear second order distortion products in the LNA 601. A single-ended radio frequency (RF) input signal is provided through an external inductance 602 to a main LNA stage 610. The main LNA stage 610 comprises a transistor 612 and a transistor 614. In an exemplary embodiment, the transistor 612 operates as a gain transistor and the transistor 614 operates as a cascode transistor. The transistor 612 is biased by a signal, vb1, on connection 606 applied to its gate through a resistance 605. The single-ended RF input signal on connection 603 is provided to the gate of the transistor 612. The source of the transistor 612 is connected to a source degeneration inductance 604. The drain of the transistor 612 is coupled to the source of the transistor 614. The output of the main LNA stage 610 is provided from the drain of the transistor 614 to a load circuit 630 over connection 615 and through a capacitance 639. The current flowing in connection 615 can be referred to as "Isig_main." The load circuit 630 is an inductive circuit and can also be referred to herein as a balun, which performs single-ended to differential conversion. The load circuit 630 generally comprises a primary side 632 and a secondary side 634. A single-ended RF communication signal is provided to the primary side 632 of the load circuit 630. The output of the load circuit 630 is provided from the secondary side 634 as a differential RF signal to a mixer 643 for downconversion and further processing.

The circuit 600 also comprises an auxiliary LNA stage 620. The auxiliary LNA stage 620 comprises a transistor 622 and a transistor 624. In an exemplary embodiment, the transistor 622 operates as a gain transistor and the transistor 624 operates as a cascode transistor. The transistor 622 is controlled and biased by a signal, vb2, on connection 627 applied to its gate through a resistor 623. The gate of the transistor 622 is connected to the drain of the transistor 612 through a capacitance 626. The drain of the transistor 622 is coupled to the source of the transistor 624. The output of the auxiliary LNA stage 620 is provided from the drain of the transistor 624 to the load circuit 630 over connection 625 and through a capacitance 641. The current flowing in connection 625 can be referred to as "Isig_aux."

In an exemplary embodiment, the primary side 632 of the load circuit 630 includes a non-center tap 635 at a system voltage VDD that divides the primary side 632 into a first, or main, portion 636 and a second, or auxiliary, portion 637. The main portion 636 receives the output of the main LNA stage 610 over connection 615 and through a capacitance 639. The auxiliary portion 637 receives the output of the auxiliary LNA stage 620 over connection 625 and through a capacitance 641. In this exemplary embodiment, the non-center tap 635 establishes an auxiliary inductance portion 651 having an inductance different than an inductance of the main inductance portion 652.

To minimize current consumption in the auxiliary LNA stage 620, the physical size of the transistors 622 and 624 is generally smaller than the physical size of the transistors 612 and 614, respectively, so that the current Isig_aux on connection 625 is smaller than the current Isig_main on connection 615 such that the signal generated by the auxiliary LNA stage 620 is smaller than the signal generated by the main LNA stage 610. In operation, the transistor 622 is generally biased in a non-linear region so that non-linear second order products generated by the auxiliary LNA stage 620 can be generated which are higher than and which can cancel the non-linear second products generated by the main LNA stage 610, even though the transistors 622 and 624 are respectively smaller than the transistors 612 and 614. In this manner, the operation of the auxiliary LNA stage 620 generally cancels any non-linear second order (and all even order) products generated by the transistor 612. The non-linear second order products generated by the auxiliary LNA stage 620 are higher than the non-linear second order products generated by the main LNA stage 610, so adjusting the inductance of the auxiliary inductance portion 651 relative to the inductance of the main inductance portion 652 by determining the location of the non-center tap 635 causes the non-linear second order products produced by the auxiliary LNA stage 620 to match the levels of the non-linear second order products produced by the main LNA stage 610, such that the non-linear second order products produced by the main LNA stage 610 are canceled by the non-linear second order products produced by the auxiliary LNA stage 620.

The inductance of the auxiliary inductance portion 651 and the inductance of the main inductance portion 652 are selected to match the gain of the auxiliary LNA stage 620 to the gain of the main LNA stage 610 at the frequency associated with the non-linear second order product. In other words, the inductance of the auxiliary inductance portion 651 and the inductance of the main inductance portion 652 are selected to ensure that the gain of the second order product of the auxiliary LNA stage 620 matches the gain of the second order product of the main LNA stage 610 so that these products cancel at the second order frequency.

The non-center tapped load circuit 630 can be implemented to adjust the gain of the auxiliary LNA stage 620 relative to the gain of the main LNA stage 610 by locating the tap 635 such that an inductance of the auxiliary portion 651 of the primary side 632 of the load circuit 630 is different than an inductance of the main portion 652 of the primary side 632 of the load circuit 630. For example, if the inductance of the auxiliary portion 651 is smaller than the inductance of the main portion 652, then the gain of the auxiliary LNA stage 620 will be smaller than the gain of the main LNA stage 610. In this manner, the selection of the location of the tap 635 can control the inductance presented to the auxiliary LNA stage 620 and the inductance presented to the main LNA stage 610.

In an exemplary embodiment, the lower inductance provided by the auxiliary portion 651 of the primary side 632 of the load circuit 630 equalizes the gain of the auxiliary LNA stage 620 and the gain of the main LNA stage 610 at the frequency at which the non-linear second order products are generated, so that these non-linear second order products cancel.

Exemplary embodiments of the auxiliary LNA stage 620 can be easily incorporated into an existing LNA architecture. Exemplary embodiments of the distortion cancellation technique can be enabled and disabled dynamically with a control signal over connection 627 depending on a number of factors including, for example, whether second order non-linearity cancellation is needed. For example, the auxiliary LNA stage 620 can be activated only when carrier aggregation is present that can benefit from the second order cancellation.

Figure 7:
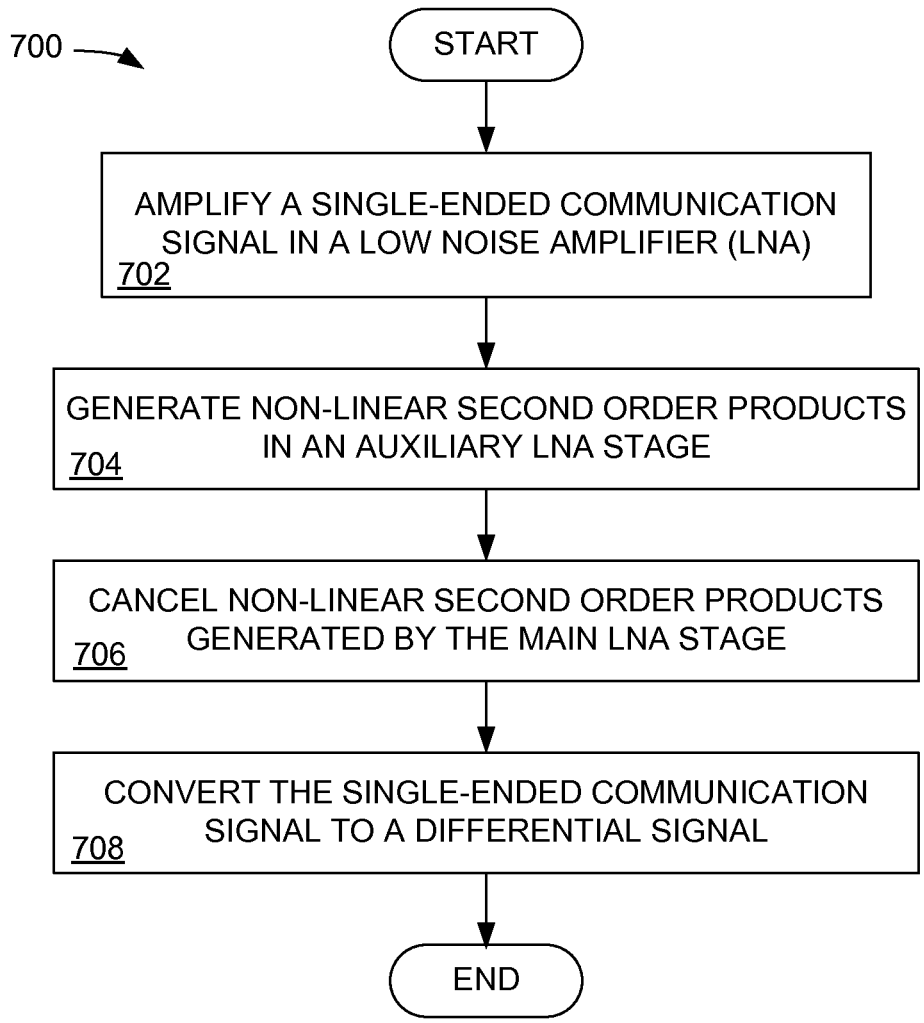
FIG. 7 is a flow chart describing the operation of an exemplary embodiment of a circuit having a low noise amplifier (LNA) that can be used to cancel non-linear second order distortion products in the LNA.

FIG. 7 is a flow chart 700 describing the operation of an exemplary embodiment of a circuit having a low noise amplifier (LNA) that can be used to cancel second order distortion products in the LNA. The blocks in the flow chart 700 can be performed in or out of the order shown, and in some embodiments, can be performed at least in part in parallel.

In block 702, a single-ended communication signal is amplified in a main low noise amplifier (LNA) having a main LNA stage and an auxiliary LNA stage. In block 704, non-linear second order products are generated by the auxiliary LNA stage.

In block 706, the non-linear second order products generated by the auxiliary LNA stage cancel non-linear second order products generated by the main LNA stage. In block 708, the load circuit converts the single-ended communication signal to a differential signal output.

The LNA circuit described herein may be implemented on one or more ICs, analog ICs, RFICs, mixed-signal ICs, ASICs, printed circuit boards (PCBs), electronic devices, etc. The LNA circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNA circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
   a main low noise amplifier (LNA) stage configured to amplify a single-ended communication signal;
   an auxiliary LNA stage coupled to the main LNA stage, the auxiliary LNA stage configured to cancel non-linear second order products generated by the main LNA stage; and
   a load circuit configured to receive an output of the main LNA stage and an output of the auxiliary LNA stage, the load circuit configured to convert the single-ended communication signal to a differential signal.

2. The device of claim 1, the main LNA stage comprises a cascode transistor arrangement, the auxiliary LNA stage comprises a cascode transistor arrangement, and the auxiliary LNA stage comprises a first transistor having a gate that is coupled to a drain of a first transistor of the main LNA stage.

3. The device of claim 2, an output of the main LNA stage is coupled to a first portion of a primary side of the load circuit and an output of the auxiliary LNA stage is coupled to a second portion of the primary side of the load circuit.

4. The device of claim 3, wherein first and second transistors of the auxiliary LNA stage are smaller than respective first and second transistors of the main LNA stage such that the signal generated by the auxiliary LNA stage is smaller than the signal generated by the main LNA stage.

5. The device of claim 4, wherein the auxiliary LNA stage is biased in a non-linear region such that non-linear products generated by the auxiliary LNA stage are higher than non-linear products generated by the main LNA stage.

6. The device of claim 5, further comprising a source follower buffer and a feedback resistance coupled between an input and an output of the main LNA stage.

7. The device of claim 5, wherein the auxiliary LNA stage is enabled in a carrier aggregation receive mode.

8. The device of claim 5, further comprising an attenuator associated with the load circuit and the auxiliary LNA stage, the attenuator configured to equalize a gain of the auxiliary LNA stage and a gain of the main LNA stage at a second order frequency.

9. The device of claim 5, wherein the first portion of the primary side of the load circuit comprises a main inductance portion and the second portion of the primary side of the load circuit comprises an auxiliary inductance portion, the main inductance portion having an inductance different than an inductance of the auxiliary inductance portion, the inductance difference between the main inductance portion and the auxiliary inductance portion configured to equalize a gain of the auxiliary LNA stage and a gain of the main LNA stage at a second order frequency.

10. A method, comprising:
    amplifying a single-ended communication signal in a low noise amplifier (LNA) having a main LNA stage coupled to an auxiliary LNA stage;
    generating non-linear second order products in the auxiliary LNA stage;
    cancelling non-linear second order products generated by the main LNA stage using the non-linear second order products generated by the auxiliary LNA stage; and
    converting the single-ended communication signal to a differential signal using a load circuit configured to receive an output of the main LNA stage and an output of the auxiliary LNA stage.

11. The method of claim 10, further comprising biasing the auxiliary LNA stage in a non-linear region to generate non-linear products in the auxiliary LNA stage that are higher than non-linear products generated by the main LNA stage.

12. The method of claim 11, further comprising enabling the auxiliary LNA stage in a carrier aggregation receive mode.

13. The method of claim 11, further comprising equalizing a gain of the auxiliary LNA stage and a gain of the main LNA stage at a second order frequency.

14. A device, comprising:
    means for amplifying a single-ended communication signal;
    means for cancelling non-linear second order products generated by first amplifier means using non-linear second order products generated by second amplifier means; and
    means for converting the single-ended communication signal to a differential signal.

15. The device of claim 14, further comprising means for biasing the second amplifier means in a non-linear region to generate non-linear products in the second amplifier means that are higher than non-linear products generated by the first amplifier means.

16. The device of claim 15, further comprising means for enabling the second amplifier means in a carrier aggregation receive mode.

17. The device of claim 15, further comprising means for equalizing a gain of the second amplifier means and a gain of the first amplifier means at a second order frequency.

18. The device of claim 17, wherein the means for equalizing comprises means for attenuating a gain of the second amplifier means.

* * * * *